(12) United States Patent
Liu et al.

(10) Patent No.: US 10,566,337 B2
(45) Date of Patent: Feb. 18, 2020

(54) METHOD OF MANUFACTURING MEMORY DEVICE

(71) Applicant: Winbond Electronics Corp., Taichung (TW)

(72) Inventors: Chung-Hsien Liu, Taichung (TW); Chun-Hsu Chen, Taichung (TW); Lu-Ping Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/215,666

(22) Filed: Dec. 11, 2018

(65) Prior Publication Data

US 2019/0319037 A1   Oct. 17, 2019

(30) Foreign Application Priority Data

Apr. 16, 2018   (TW) .............................. 107112931 A

(51) Int. Cl.
*H01L 27/11531* (2017.01)
*H01L 21/762* (2006.01)
(Continued)

(52) U.S. Cl.
CPC .. *H01L 27/11531* (2013.01); *H01L 21/76237* (2013.01); *H01L 27/11521* (2013.01);
(Continued)

(58) Field of Classification Search
CPC ......... H01L 21/31155; H01L 21/76237; H01L 21/31116; H01L 21/31111; H01L 21/311; H01L 21/31105; H01L 21/823481; H01L 27/11531; H01L 27/11517; H01L 27/11541; H01L 27/11543;
(Continued)

(56) References Cited

U.S. PATENT DOCUMENTS 7,541,240 B2 *   6/2009   Pham .................. H01L 21/3212
                                                           438/257
8,043,933 B2 *  10/2011   Kao ................... H01L 27/11521
                                                           257/E21.546

(Continued)

FOREIGN PATENT DOCUMENTS

| TW | 201330266 | 7/2013 |
| TW | 201643960 | 12/2016 |
| TW | I618224 | 3/2018 |

*Primary Examiner* — Michael M Trinh
(74) *Attorney, Agent, or Firm* — JCIPRNET

(57) ABSTRACT

Provided is a method of manufacturing a memory device including following steps. A substrate including an active region and a periphery region. A stack layer is formed on the substrate. A first trench is formed in the substrate and the stack layer in the active region. A first isolation structure is formed in the first trench. An ion implantation process is performed to form a doped first isolation structure. A first wet etching process is performed to remove a portion of the doped first isolation structure, so that a first recess is formed on the doped first isolation structure. A protection layer is formed on the substrate to at least cover sidewalls of the first recess. A second wet etching process is performed to remove the protection layer and another portion of the doped first isolation structure and deepen the first recess. A SICONI etching process is performed.

10 Claims, 4 Drawing Sheets

(51) Int. Cl.
  *H01L 27/11521* (2017.01)
  *H01L 27/11541* (2017.01)
  *H01L 21/311* (2006.01)
  *H01L 21/3115* (2006.01)
  *H01L 21/28* (2006.01)

(52) U.S. Cl.
  CPC ... *H01L 27/11541* (2013.01); *H01L 21/31111* (2013.01); *H01L 21/31116* (2013.01); *H01L 21/31155* (2013.01); *H01L 29/40114* (2019.08)

(58) Field of Classification Search
  CPC ............... H01L 27/11521; H01L 27/11; H01L 27/1116; H01L 29/40114
  See application file for complete search history.

(56) References Cited

U.S. PATENT DOCUMENTS

| | | | |
|---|---|---|---|
| 8,686,535 B2 * | 4/2014 | Sandhu | H01L 21/76237 257/510 |
| 2007/0210366 A1 | 9/2007 | Sandhu et al. | |
| 2017/0194189 A1 * | 7/2017 | Chen | H01L 21/76 |
| 2018/0308929 A1 * | 10/2018 | Liu | H01L 21/76224 |
| 2018/0350608 A1 * | 12/2018 | Liu | H01L 29/42324 |

* cited by examiner

METHOD OF MANUFACTURING MEMORY DEVICE

CROSS-REFERENCE TO RELATED APPLICATION

This application claims the priority benefit of Taiwan application serial no. 107112931, filed on Apr. 16, 2018. The entirety of the above-mentioned patent application is hereby incorporated by reference herein and made a part of this specification.

BACKGROUND

Technical Field

The present disclosure relates to a method of manufacturing a semiconductor device, and particularly to a method of manufacturing a memory device.

Description of Related Art

For the past few years, flash memory has become the main stream of nonvolatile memory device with the advantages of high density, low cost, being rewritable and electrically-erasable. Also, flash memory is commonly applied in various portable electronic products.

With shrinkage of memory manufacturing process, general manufacturing process of flash memory have the following problems. The etching rate of wet etching process is too fast for isolation structure, which leads to poor uniformity of the top surface of isolation structure, and the reliability and yield rate of device is reduced as well. In view of the above, it is an important issue to find out how to provide a method of manufacturing memory device capable of improving uniformity of the top surface of isolation structure, thereby improving reliability and yield rate of memory device.

SUMMARY

The disclosure provides a method of manufacturing memory device, capable of improving uniformity of the top surface of isolation structure, thereby improving reliability and yield rate of memory device.

The disclosure provides a method of manufacturing a memory device, the method includes the following steps. A substrate is provided, including an active region and a periphery region. A stack layer is formed on the substrate. A first trench is formed in the substrate and the stack layer in the active region. A first isolation structure is formed in the first trench. An ion implantation process is performed such that the first isolation structure is changed into a doped first isolation structure. A first wet etching process is performed to remove a portion of the doped first isolation structure such that a first recess is formed on the doped first isolation structure. A protection layer is formed on the substrate to at least cover a sidewall of the first recess. A second wet etching process is performed to remove the protection layer and another portion of the doped first isolation structure to deepen the first recess. A SICONI etching process is performed to remove the doped first isolation structure on an upper sidewall of the first trench.

Based on the above, in the disclosure, a portion of the first isolation structure in the active region is selectively removed without removing a second isolation structure in the periphery region by using a mask pattern, so that the top surface of the first isolation structure is lower than the top surface of an adjacent first conductive layer, and thereby exposing the sidewall of the adjacent first conductive layer. In this manner, a contact area between the first conductive layer and the subsequently formed second conductive layer may be increased so that the gate-coupling ratio (GCR) may be enhanced. Additionally, the height difference between the top surface of the second isolation structure and the top surface of the adjacent first conductive layer may be reduced so that the difference in the topography of the layers that are formed subsequently may be improved.

Moreover, the disclosure utilizes ion implantation process to change the non-doped isolation structure into a doped isolation structure. As compared with non-doped isolation structure, the wet etching process that is performed subsequently has slower and more stable etching rate for the doped isolation structure. Accordingly, after the wet etching process is performed, the uniformity of the top surface of the doped isolation structure becomes better, and thus the reliability and yield rate of the memory device may be enhanced as well.

To make the foregoing features and advantages of the present invention clearer and more comprehensible, embodiments are described below in detail with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
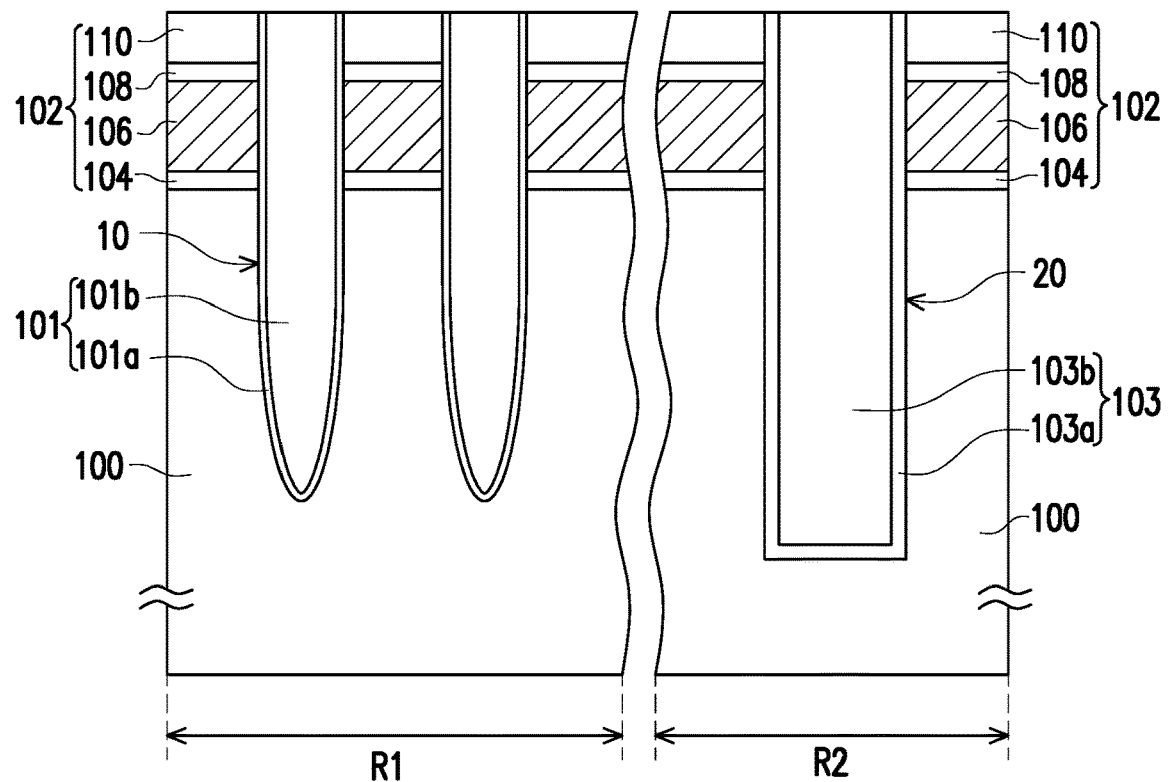
FIG. 1A to FIG. 1G are schematic cross-sectional views illustrating a manufacturing process of a memory device according to an embodiment of the disclosure.

The invention described in several embodiments is elaborated with reference to the accompanying drawings. Note that the invention may be embodied in various ways and should not be limited to the embodiments provided herein. The thicknesses of layers and regions provided in the drawings are enlarged for illustrative purposes. The same or similar reference numbers represent the same or similar components and thus will not be described in each and every paragraphs below.

In addition, the memory device described in the following paragraphs is exemplified as a flash memory, which should not be construed as a limitation to the invention.

Referring to FIG. 1A, the embodiment provides a method of manufacturing a memory device, including the following steps. First of all, a substrate 100 is provided. The substrate 100 includes an active region R1 and a periphery region R2. In an embodiment, the active region R1 may include a plurality of memory units (e.g., flash memory, DRAM, SRAM, etc.) therein; the periphery region R2 may include a plurality of logic circuits (e.g., transistor) therein. In other embodiments, the periphery region R2 may include a memory therein.

Thereafter, a stack layer 102 is formed on the substrate 100. Specifically, the stack layer 102 includes a first dielectric layer 104, a first conductive layer 106, a second dielectric layer 108 and a cap layer 110 arranged upward from the substrate 100 in order.

In the embodiment, the first dielectric layer 104 may be, for example, a tunnel dielectric layer. In an embodiment, the material of the first dielectric layer 104 includes silicon oxide, silicon oxynitride, silicon nitride or other suitable dielectric material, the forming method thereof includes chemical vapor deposition or furnace oxidation, and the thickness thereof may be 6 nm to 8 nm.

In the embodiment, the first conductive layer 106 may be a floating gate. In an embodiment, the material of the first conductive layer 106 includes doped polysilicon, non-doped polysilicon or a combination thereof, the forming method thereof may be chemical vapor deposition, and the thickness thereof may be 70 nm to 100 nm. For example, the first conductive layer 106 may be p-type polysilicon layer, and the dopant thereof may be boron (e.g., $BF_2$).

In an embodiment, the material of the second dielectric layer 108 includes silicon oxide, silicon oxynitride, silicon nitride or other suitable dielectric material, the forming method thereof includes chemical vapor deposition method or furnace oxidation, and the thickness thereof may be 5 nm to 10 nm.

In an embodiment, the material of the cap layer 110 includes non-doped silicon nitride, the forming method thereof includes chemical vapor deposition, and the thickness thereof may be 35 nm to 80 nm.

Subsequently, a plurality of first trenches 10 are formed in the substrate 100 and the stack layer 102 in the active region R1, and a second trench 20 is formed in the substrate 100 and the stack layer 102 in the periphery region R2. In an embodiment, as shown in FIG. 1A, the depth of the second trench 20 is larger than the depth of the first trench 10.

Thereafter, a first isolation structure 101 is formed in the first trench 10, and a second isolation structure 103 is formed in the second trench 20. Specifically, the first isolation structure 101 may include a liner 101a and an isolation material 101b. The liner 101a is formed conformally in the first trench 10 to cover the sidewall and bottom surface of the first trench 10. The isolation material 101b is formed on an inner surface of the liner 101a and fills the first trench 10 to the full. As shown in FIG. 1A, the liner 101a wraps or encapsulates the isolation material 101b such that the liner 101a is disposed between the substrate 100 and the isolation material 101b. In an embodiment, the liner 101a may be a high temperature oxide (HTO). The isolation material 101b may be a spin-on glass (SOG). In an embodiment, the first isolation structure 101 may be a shallow trench isolation structure (STI).

Similarly, the second isolation structure 103 may include a liner 103a and an isolation material 103b. The material and configuration of the liner 103a and the isolation material 103b are similar to the material and configuration of the liner 101a and isolation material 101b, and thus no repetition is incorporated herein. In an embodiment, the second isolation structure 103 may be a shallow isolation structure (STI).

In an embodiment, after the first isolation structure 101 is formed, the second isolation structure 103 is formed subsequently, which should not be construed as a limitation to the disclosure. The second isolation structure 103 may be formed first, and the first isolation structure 101 is formed subsequently. As shown in FIG. 1A, after the first isolation structure 101 and the second isolation structure 103 are formed, a planarization process (e.g., CMP process) is performed such that the top surface of the cap layer 110, the top surface of the first isolation structure 101 and the top surface of the second isolation structure 103 are coplanar.

Figure 1B:
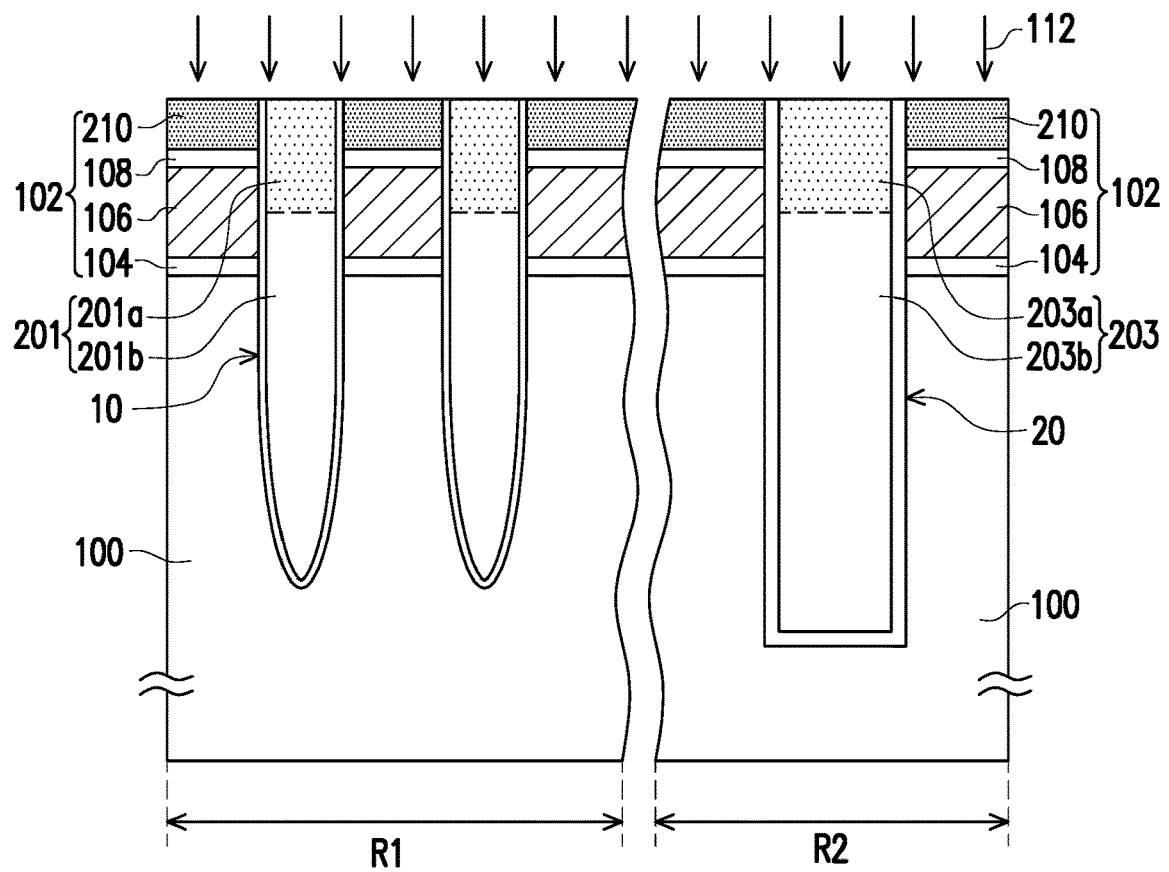

Referring to FIG. 1B, an ion implantation process 112 is performed such that the non-doped first isolation structure 101 is changed into a doped first isolation structure 201, the non-doped second isolation structure 103 is changed into a doped second isolation structure 203, and the non-doped cap layer 110 is changed into a doped cap layer 210. Specifically, the doped first isolation structure 201 includes an upper portion 201a and a lower portion 201b. After the ion implantation process 112 is performed, only the upper portion 201a is doped; the lower portion 201b remains non-doped. In the following descriptions, the first isolation structure having the upper portion 201a and the lower portion 201b is referred to as the doped first isolation structure 201. Likewise, the doped second isolation structure 203 includes the doped upper portion 203a and the non-doped lower portion 203b. In the following descriptions, the second isolation structure having the upper portion 203a and the lower portion 203b is referred to as the doped second isolation structure 203. In an embodiment, the dopant implanted through the ion implantation process 112 may be boron (e.g., $BF_2$), the doping concentration thereof may be, for example, $2.5 \times 10^{15}/cm^3$ to $5 \times 10^{15}/cm^3$, and the doping energy may be, for example, 30 KeV to 50 KeV, which should not be construed as a limitation to the disclosure. In other embodiments, the dopant implanted through the ion implantation process 112 has the same conductive type as the first conductive layer 106 to avoid affecting the conductive type of the first conductive layer 106. In other embodiments, the height of the doped upper portion 201a and the upper portion 203a is about 50 nm to 90 nm.

Figure 1C:
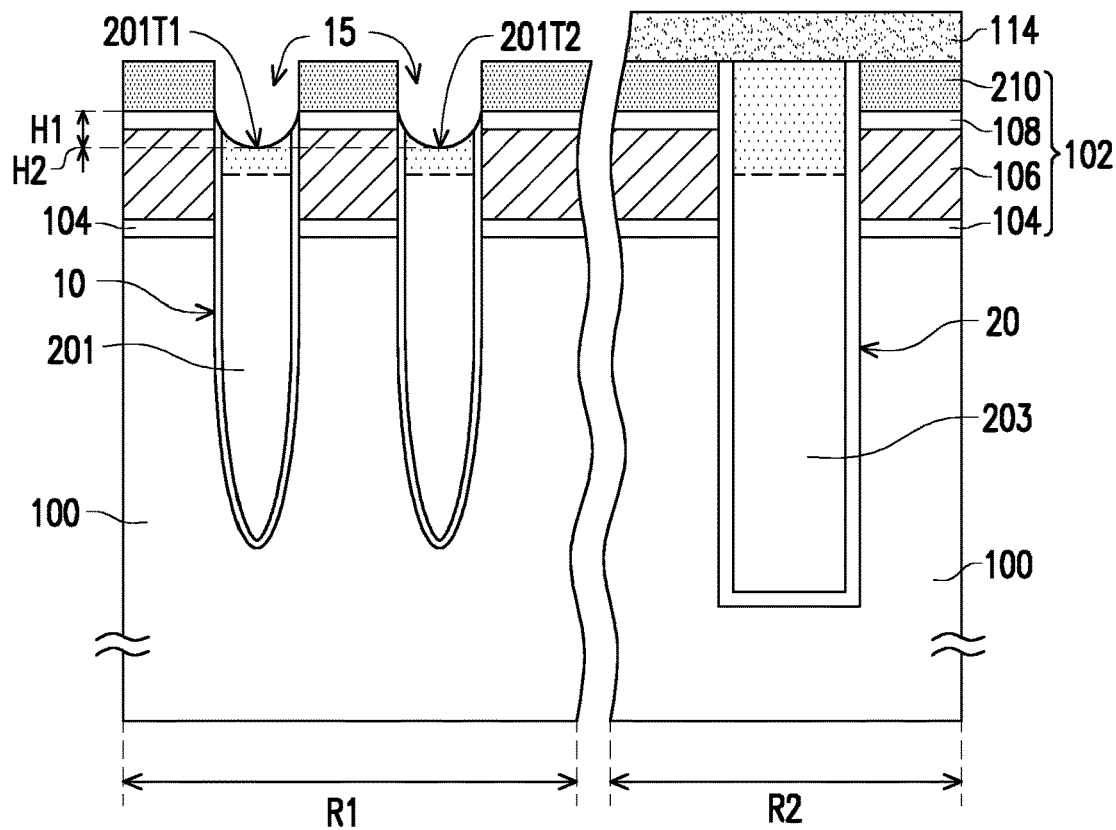

Referring to FIG. 1B and FIG. 1C, a mask pattern 114 is formed on the stack layer 102 in the periphery region R2. The mask pattern 114 covers the stack layer 102 and the doped second isolation structure 203 in the periphery region R2, while the stack layer 102 and the doped first isolation structure 201 in the active region R1 are exposed. In an embodiment, the mask pattern 114 may be a photoresist material.

Next, a first wet etching process is performed to remove a portion of the doped first isolation structure 201 by using the mask pattern 114 as a mask, such that a first recess 15 is formed on the doped first isolation structure 201. In this manner, as shown in FIG. 1C, during the first wet etching process, the doped second isolation structure 203 is not removed. In an embodiment, the first wet etching process may be performed by using, for example, buffered hydrofluoric acid (BHF), and the process time may be adjusted depending on the required depth. In the embodiment, the bottom surface of the first recess 15 is at least higher than the top surface of the first dielectric layer 104.

It should be mentioned that the ion implantation process 112 changes the non-doped first isolation structure 101 into the doped first isolation structure 201. As compared with the non-doped first isolation structure 101, the first wet etching process has slower and more stable etching rate for the doped first isolation structure 201. In this manner, after the first wet etching process is performed, the uniformity of the top surfaces 201T1, 201T2 of the doped first isolation structure 201 becomes better. Herein, the "uniformity" may be regarded as a height difference H1 between the highest point and the lowest point of the top surface 201T1 of one of the first isolation structures 201. In the embodiment, the height difference H1 is in the range of 10 nm to 50 nm. Additionally, the "uniformity" may be regarded as a height difference H2 between the lowest point of the top surface 201T1 of one of the first isolation structures 201 and the lowest point of the top surface 201T2 of another one of the first isolation structures 201. In the embodiment, the height difference H2 is 0 Å to 30 Å. In other words, the uniformity of the top surface of a single first isolation structure 201 and the top surface of each of the first isolation structures 201 are all improved.

Figure 1D:
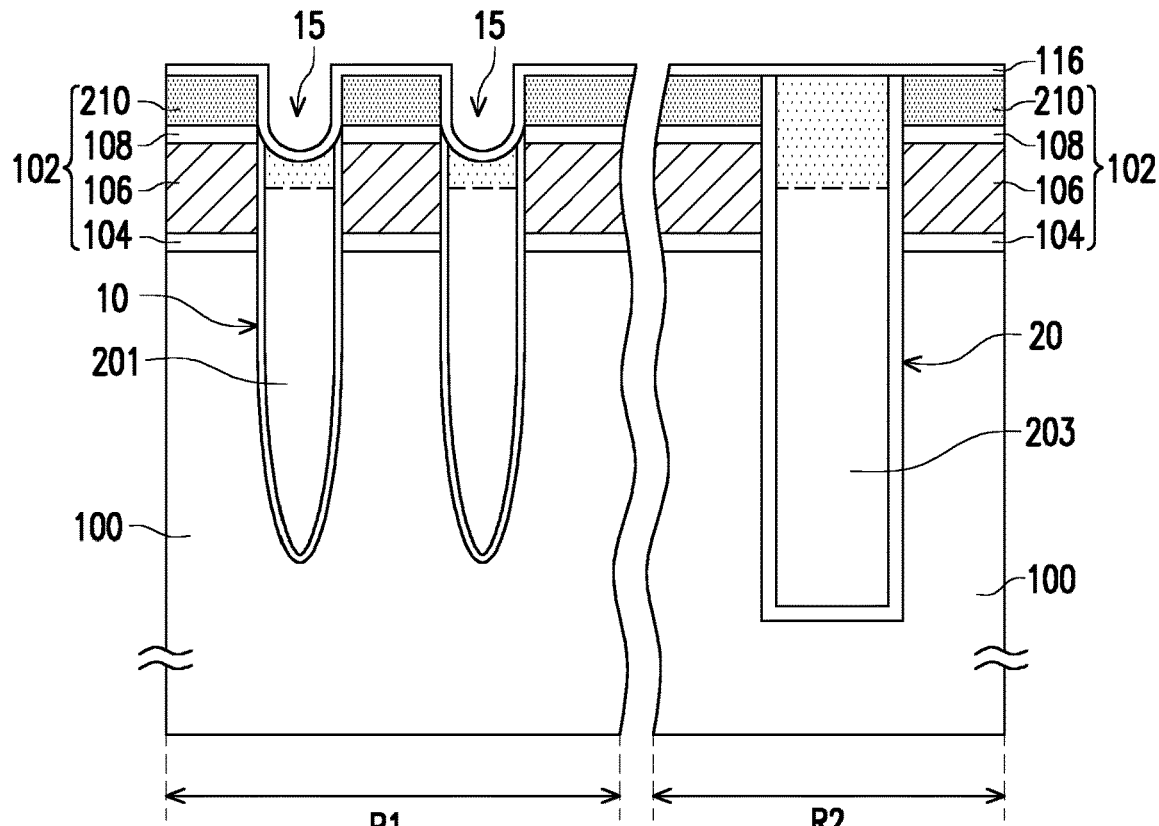

Referring to FIG. 1C and FIG. 1D, after the mask pattern 114 is removed, a protection layer 116 is formed conformally on the substrate 100. The protection layer 116 covers the top surface of the cap layer 210, the sidewall and bottom surface of the first recess 15 (or top surfaces 201T1, 201T2 of the doped first isolation structure 201) and the top surface of the doped second isolation structure 203. In an embodiment, the material of the protection layer 116 includes silicon oxide, the forming method thereof includes atomic layer deposition (ALD), and the thickness thereof may be 2 nm to 10 nm. In the embodiment, the protection layer 116 may protect the sidewall of the first conductive layer 106 (i.e., floating gate) to prevent the subsequent second wet etching process from causing damage to the first conductive layer 106, thereby improving the reliability and yield rate of the memory device.

Figure 1E:
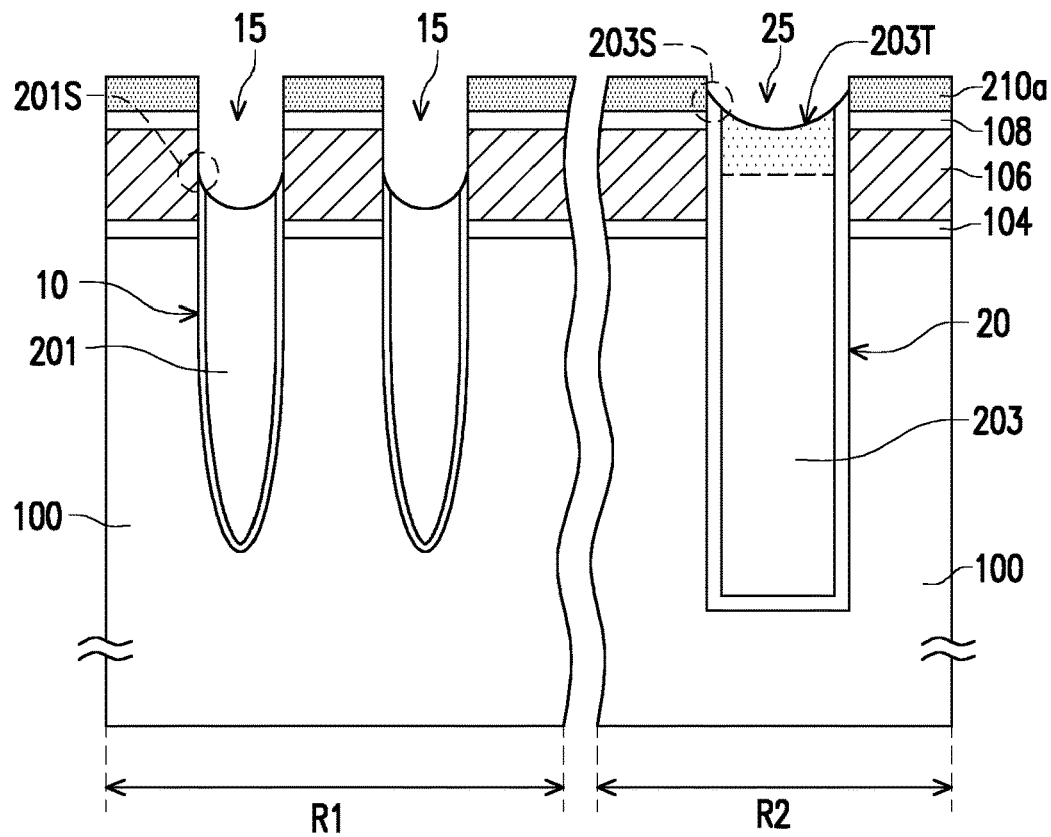

Next, referring to FIG. 1D and FIG. 1E, the second wet etching process is performed to remove the protection layer 116 and remove another portion of the doped first isolation structure 201 such that the depth of the first recess 15 is deepened, and a portion of the doped second isolation structure 203 is removed such that a second recess 25 is formed on the doped second isolation structure 203. After the second wet etching process is performed, as shown in FIG. 1E, the first recess 15 exposes the sidewall of the first conductive layer 106. In this manner, the contact area between the first conductive layer 106 and the subsequently formed second conductive layer 120 (as shown in FIG. 1G) may be increased, thereby enhancing gate-coupling ratio. In an embodiment, as shown in FIG. 1E, the second wet etching process not only completely removes the protection layer 116 but also removes a portion of the doped cap layer 210 under the protection layer 116. In an embodiment, the second wet etching process may be performed by using, for example, buffered hydrofluoric acid (BHF), and the process time may be adjusted depending on the required depth. In an embodiment, the bottom surface of the second recess 25 (or top surface 203T of the doped second isolation structure 203) is at least lower than the bottom surface of the doped cap layer 210a. In other embodiments, the bottom surface of the second recess 25 (or top surface 203T of the doped second isolation structure 203) is at least higher than or aligned with the top surface of the first conductive layer 106 (i.e., floating gate).

Figure 1F:
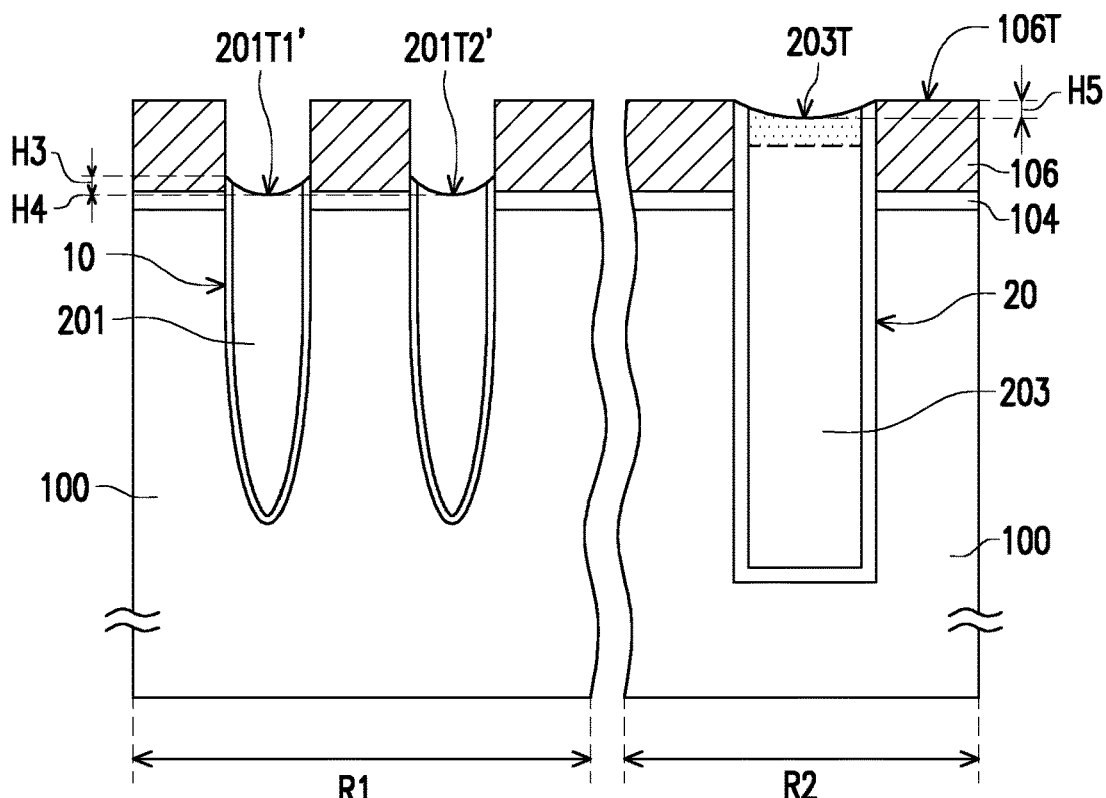
Figure 1G:
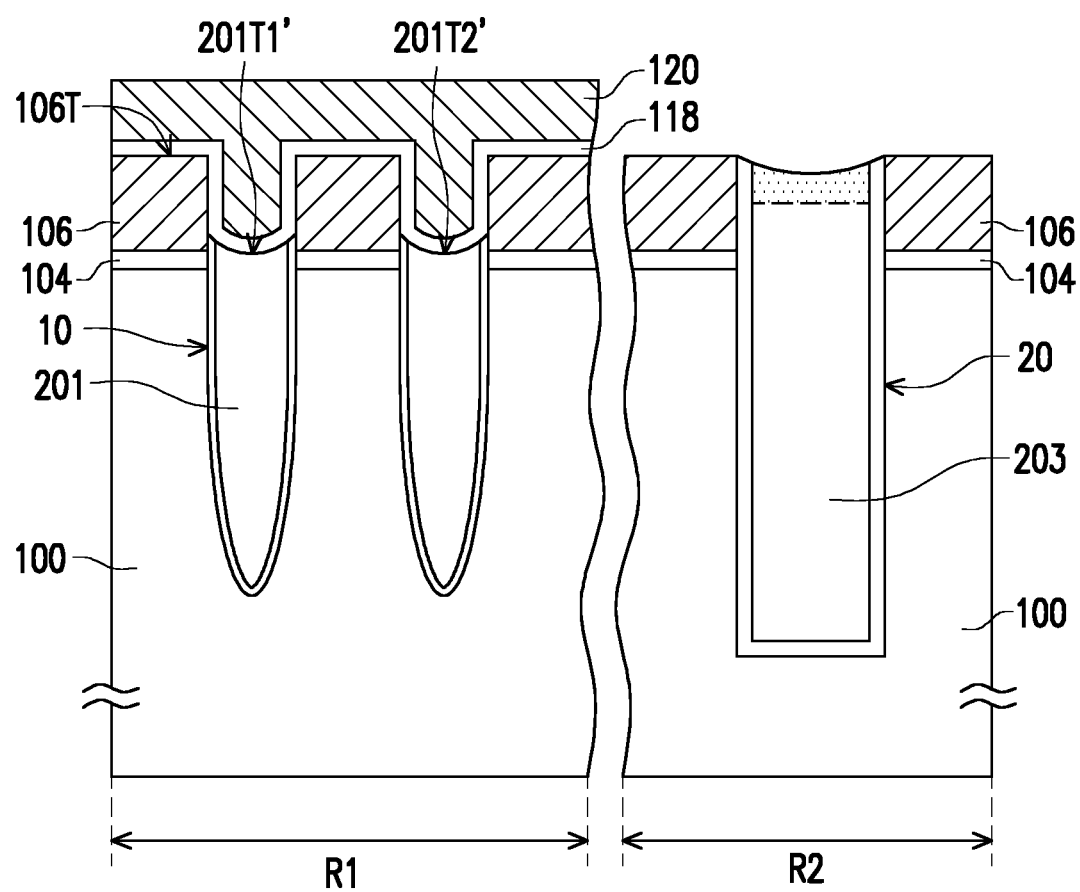

Referring to FIG. 1E and FIG. 1F, a SICONI etching process is performed to remove a doped first isolation structure 201S (as shown in FIG. 1E) on the upper sidewall of the first trench 10 and a doped second isolation structure 203S (as shown in FIG. 1E) on the upper sidewall of the second trench 20. In an embodiment, the SICONI etching process is a low power dry etching process, which uses $NH_3$ and $NF_3$ as etching gas to remove oxide on the sidewall. In an embodiment, the RF power of the SICONI etching process may be 50 W to 300 W.

It should be mentioned that, after the SICONI etching process is performed, the doped cap layer 210a and the second dielectric layer 108 are completely removed, thereby exposing the top surface of the first conductive layer 106. Since the power of the SICONI etching process is far lower than conventional dry etching process (e.g., reactive ion etching (RIE) process), the SICONI etching process do not cause damage to the surface of the first conductive layer 106 (i.e., floating gate).

In an embodiment, the SICONI etching process is performed directly after the second wet etching process without using phosphoric acid-containing solution to remove the doped cap layer 210a and the second dielectric layer 108. In this manner, the manufacturing method in the embodiment may prevent the phosphoric acid-containing solution from continuously removing the doped first isolation structure 201 and the doped second isolation structure 203, causing the uniformity of the top surfaces of the two to be deteriorated. In an alternative embodiment, the entire manufacturing method do not use phosphoric acid-containing etching solution. That is to say, the phosphoric acid-containing solution is not used throughout the first wet etching process and the second wet etching process.

In the embodiment, as shown in FIG. 1F, after the SICONI etching process is performed, the height difference H3 between the highest point and the lowest point of a top surface 201T1' of one of the first isolation structures 201 is 10 Å to 30 Å. A height difference H4 between the lowest point of the top surface 201T1' of one of the first isolation structures 201 and the lowest point of a top surface 201T2' of another one of the first isolation structures 201 is 0 Å to 30 Å. A height difference H5 is generated between the top surface 203T of the doped second isolation structure 203 and the top surface 106T of the first conductive layer 106, and the height difference H5 is smaller than 20 nm. It should be indicated that the smaller the height difference H5 is, the smaller the difference is generated in the topography of the layers that are formed subsequently, which facilitates formation of logic circuit in the periphery region R2.

Thereafter, referring to FIG. 1F and FIG. 1G, a third dielectric layer 118 and the second conductive layer 120 are formed in order on the substrate 100 in the active region R1. The third dielectric layer 118 conformally covers the top surfaces 201T1' and 201T2' of the doped first isolation structure 201 as well as the top surface 106T of the first conductive layer 106. In an embodiment, the third dielectric layer 118 may be a composite layer structure constructed by silicon oxide/silicon nitride/silicon oxide, which should not be construed as a limitation to the disclosure. In other embodiments, the third dielectric layer 118 may be a composite layer structure with a random number of layer constructed by silicon oxide and silicon nitride. In an embodiment, the material of the second conductive layer 120 includes doped polysilicon, non-doped polysilicon or a combination thereof. The second conductive layer 120 may be a control gate; the third dielectric layer 118 may be an interlayer dielectric layer between the first conductive layer 106 (i.e., floating gate) and the second conductive layer 120 (i.e., control gate).

To sump up, in the disclosure, a portion of the first isolation structure in the active region is selectively removed without removing a second isolation structure in the periphery region by using a mask pattern, so that the top surface of the first isolation structure is lower than the top surface of an adjacent first conductive layer, and thereby exposing the sidewall of the adjacent first conductive layer. In this manner, a contact area between the first conductive layer and the subsequently formed second conductive layer may be increased so that the gate-coupling ratio may be enhanced. Additionally, the height difference between the top surface of the second isolation structure and the top surface of the adjacent first conductive layer may be reduced so that the difference in the topography of the layers that are formed subsequently may be improved.

Moreover, the disclosure utilizes ion implantation process to change the non-doped isolation structure into a doped isolation structure. As compared with non-doped isolation structure, the wet etching process that is performed subsequently has slower and more stable etching rate for the doped isolation structure. Accordingly, after the wet etching process is performed, the uniformity of the top surface of the doped isolation structure becomes better, and thus the reliability and yield rate of the memory device may be enhanced as well.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing a memory device, comprising:
   providing a substrate, comprising an active region and a periphery region;
   forming a stack layer on the substrate;
   forming a first trench in the substrate and the stack layer in the active region;
   forming a first isolation structure in the first trench;
   performing an ion implantation process to change the first isolation structure into a doped first isolation structure;
   performing a first wet etching process to remove a portion of the doped first isolation structure, such that a first recess is formed on the doped first isolation structure;
   forming a protection layer on the substrate to at least cover a sidewall of the first recess;
   performing a second wet etching process to remove the protection layer and another portion of the doped first isolation structure, such that the first recess is deepened; and
   performing a SICONI etching process to remove the doped first isolation structure on an upper sidewall of the first trench.

2. The method of manufacturing the memory device as claimed in claim 1, wherein the stack layer comprises a first dielectric layer, a conductive layer, a second dielectric layer and a cap layer formed upward from the substrate in order.

3. The method of manufacturing the memory device as claimed in claim 2, wherein the conductive layer comprises a doped polysilicon.

4. The method of manufacturing the memory device as claimed in claim 3, wherein a dopant implanted through the ion implantation process has the same conductive type as the conductive layer.

5. The method of manufacturing the memory device as claimed in claim 2, further comprising:
   forming a second trench in the substrate and the stack layer in the periphery region;
   forming a second isolation structure in the second trench;
   performing the ion implantation process to change the second isolation structure into a doped second isolation structure;
   forming a mask pattern on the stack layer in the periphery region;
   performing the first wet etching process to remove the portion of the doped first isolation structure without removing the doped second isolation structure by using the mask pattern as a mask and;
   removing the mask pattern;
   conformally forming the protection layer on the substrate;
   performing the second wet etching process to completely remove the protection layer, remove the another portion of the doped first isolation structure and a portion of the doped second isolation structure; and
   performing the SICONI etching process to remove the doped first isolation structure on the upper sidewall of the first trench and the doped second isolation structure on an upper sidewall of the second trench.

6. The method of manufacturing the memory device as claimed in claim 5, wherein the SICONI etching process is performed directly after the second wet etching process without using a phosphoric acid-containing solution to completely remove the cap layer and the second dielectric layer, thereby exposing a top surface of the conductive layer.

7. The method of manufacturing the memory device as claimed in claim 6, wherein after the SICONI etching process is performed, a height difference is generated between a top surface of the doped second isolation structure and a top surface of the conductive, the height difference is smaller than 20 nm.

8. The method of manufacturing the memory device as claimed in claim 2, wherein after the ion implantation process is performed, the cap layer is changed from a non-doped cap layer into a doped cap layer.

9. The method of manufacturing the memory device as claimed in claim 1, wherein after the SICONI etching process is performed, a height difference between a highest point and a lowest point of a top surface of the doped first isolation structure is 10 Å to 30 Å.

10. The method of manufacturing the memory device as claimed in claim 1, wherein the number of the first isolation structure is plural, after the SICONI etching process is performed, a height difference between a lowest point of a top surface of one of the plurality of doped first isolation structures and a lowest point of a top surface of another one of the plurality of doped first isolation structures is 0 Å to 30 Å.

* * * * *